United States Patent
Winterton et al.

[11] Patent Number: 5,874,127
[45] Date of Patent: Feb. 23, 1999

[54] METHOD AND APPARATUS FOR GASEOUS TREATMENT

[75] Inventors: Lynn C. Winterton, Alpharetta; Timothy Grant, Duluth, both of Ga.

[73] Assignee: CIBA Vision Corporation, Duluth, Ga.

[21] Appl. No.: 515,633

[22] Filed: Aug. 16, 1995

[51] Int. Cl.$^6$ .................................. B05D 5/06; C23C 16/00
[52] U.S. Cl. .................. 427/164; 427/255.6; 427/385.5; 427/536; 118/500; 118/728
[58] Field of Search ................. 427/164, 385.5, 427/536, 255.6; 118/500, 728

[56] References Cited

U.S. PATENT DOCUMENTS

| | | | |
|---|---|---|---|
| 2,936,222 | 5/1960 | Stevens | 23/292 |
| 4,032,440 | 6/1977 | Yaseida | 210/23 |
| 4,137,550 | 1/1979 | Kuganowicz et al. | 358/128 |
| 4,312,575 | 1/1982 | Peyman et al. | 351/160 |
| 4,501,805 | 2/1985 | Yasuda et al. | 429/174 |
| 4,503,133 | 3/1985 | van Lier et al. | 429/174 |
| 4,632,844 | 12/1986 | Yasuda et al. | 427/38 |
| 4,692,347 | 9/1987 | Yasuda | 427/40 |
| 4,749,457 | 6/1988 | Yasuda et al. | 204/150 |
| 4,948,485 | 8/1990 | Wallsten et al. | 204/164 |
| 4,980,196 | 12/1990 | Yasuda et al. | 427/38 |
| 4,981,713 | 1/1991 | Yasuda et al. | 427/38 |
| 4,994,298 | 2/1991 | Yasuda | 427/41 |
| 5,176,938 | 1/1993 | Wallsten et al. | 427/447 |
| 5,182,000 | 1/1993 | Antonelli et al. | 204/181.1 |
| 5,267,390 | 12/1993 | Yang et al. | 29/527.4 |
| 5,270,082 | 12/1993 | Lin et al. | 427/539 |
| 5,278,384 | 1/1994 | Matsugawa et al. | 219/121.36 |
| 5,312,529 | 5/1994 | Antonelli et al. | 204/181.1 |

FOREIGN PATENT DOCUMENTS 338307   6/1920   Germany .

*Primary Examiner*—Janyce Bell
*Attorney, Agent, or Firm*—Michael U. Lee; R. Scott Meece

[57] ABSTRACT

A fixture device and method for uniformly and efficiently treating an article in a gaseous atmosphere. The fixture device provides a plurality of point contact support locations for supporting the article during the treatment. The fixture device and treatment method are especially useful in the plasma treatment of contact lenses to improve surface biocompatibility and hydrophilicity.

28 Claims, 3 Drawing Sheets

METHOD AND APPARATUS FOR GASEOUS TREATMENT

BACKGROUND OF THE INVENTION

1. Field of the Invention

This invention relates broadly to methods and devices for treating articles in a gaseous atmosphere. In a preferred embodiment, the invention relates to methods and devices for plasma treating ophthalmic lenses, especially contact lenses, to increase hydrophilicity.

2. Description of the Related Art

Various treatments of articles in a gaseous atmosphere are known. For example, the treatment of articles in a plasma (i.e., ionized gas) atmosphere has been used to produce surface coatings or modify the surface of an article, so that the surface properties differ from the properties of the native material. Plasma surface treatments are especially useful in the production of ophthalmic lenses, such as contact lenses.

For example, U.S. Pat. No. 4,312,575, issued to Peyman, et al., on Jan. 26, 1982, discloses the treatment of the surfaces of soft contact lenses in an electrical glow discharge polymerization process. The atmosphere consists essentially of hydrocarbons, halogenated hydrocarbons, halogenated hydrocarbons and hydrogen, hydrocarbons and an elemental halogen, and mixtures thereof. The lenses are supported in a ring structure having an arcuate slot in which the lens periphery rests. A second coating step is required in order to coat the lens periphery, because a peripheral portion of the lens is blocked by the support structure.

U.S. Pat. No. 4,632,844, issued to Yanagihar, et al., on Dec. 30, 1986, discloses an optical product having a thin surface film obtained by subjecting a mixed gas of oxygen and an alkene to plasma polymerization in the presence of the optical product. The optical product is supported on a supporting table placed inside the reaction vessel, and the exposed surface of the optical product is treated. Again, in this configuration, one half of the lens is treated and the other half is sheltered ("shadowed") from the reactive plasma.

While there have been numerous attempts at improving plasma surface treating processes, there remain problems with treatment uniformity and processing efficiency.

SUMMARY OF THE INVENTION

An object of the invention is to provide methods and devices for uniformly plasma treating the surface of an article.

Another object of the invention is to provide methods and devices for providing an ophthalmic lens with a uniform surface treatment.

A further object of the invention is to provide methods and devices for providing contact lenses with uniform ophthalmically compatible, hydrophilic coatings.

Yet another object of the invention is to provide methods and devices for plasma surface treatment which have improved efficiency.

These objects and other advantages accomplished by the innovative plasma treatment method and fixture devices of the present invention.

In one embodiment, the invention is a fixture device for uniformly and efficiently supporting an article to be treated in a gaseous atmosphere. The fixture device includes a support structure which provides a plurality of point-contact support locations for the article to be treated. The plurality of point contacts is sufficient to support said article to be treated but does not block the gaseous atmosphere in an amount which prevents substantially uniform coating of the article. A preferred device is chosen for plasma polymerization of the surface of an ophthalmic lens.

In another embodiment, the invention is an efficient method of uniformly treating the entire surface of an article. The method involves placing an article on a support structure such that the article is supported on a plurality of point-contact support locations and exposing the article to treatment gas for a time and at conditions sufficient to provide a substantially uniform surface treatment to the article. In a preferred embodiment, the article is only subjected to one treatment to produce a substantially uniformly treated surface. A preferred method involves plasma polymerization of a coating on the surface of an ophthalmic lens.

DESCRIPTION OF THE PREFERRED EMBODIMENTS

Figure 1:
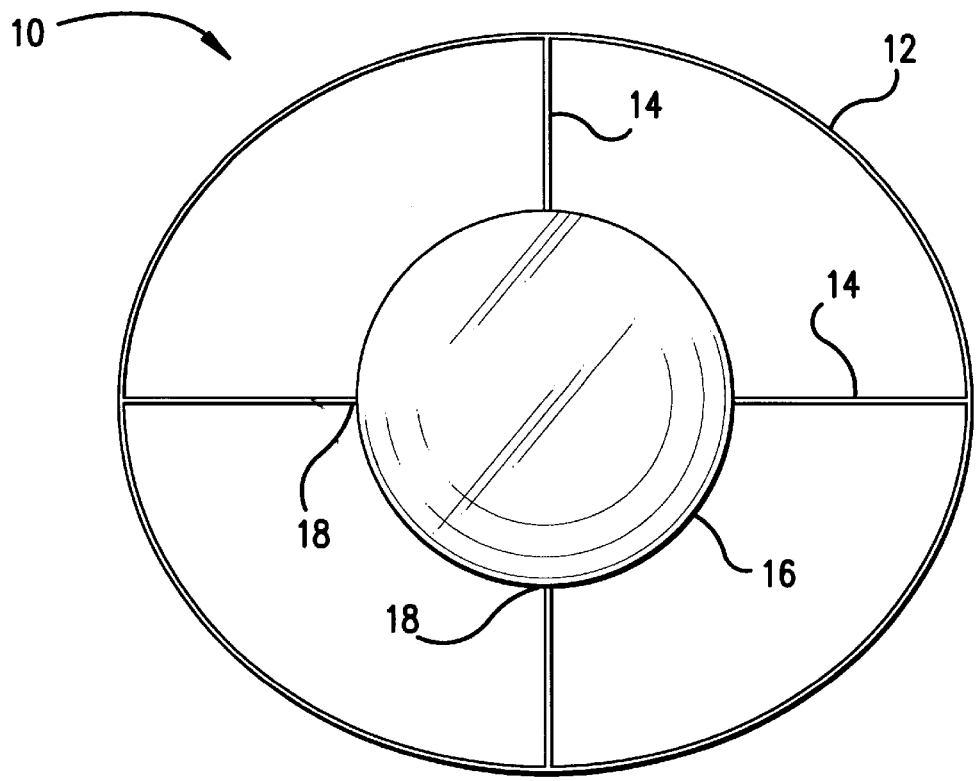
FIG. 1 is a top view of one embodiment of the fixture device of the present invention with a contact lens supported thereon.

The present fixture devices and methods are useful in the plasma coating or surface treatment of articles. The fixture devices and methods have particular utility in the surface treatment of ophthalmic lenses. An "ophthalmic lens", as used herein, refers broadly to lenses used to treat or modify the eye, ocular tissue, or ocular fluids, or to correct vision. Thus, ophthalmic lenses include, without limitation thereto, contact lenses, corneal implants and onlays, ophthalmic drug delivery devices, aesthetic lenses to change eye color, and the like. Contact lenses formed from polymers having siloxane groups are a preferred group of contact lenses which may be plasma treated in accordance with the present invention.

"Surface treatment processes", as used herein, refers to processes in which, by means of contact with a vapor, (1) a coating is applied to the surface of an article, (2) chemical species are adsorbed onto the surface of an article, (3) the chemical nature (e.g., electrostatic charge) of chemical groups on the surface of an article are altered, or (4) the surface properties of an article are otherwise modified. A preferred class of surface treatment processes are plasma processes, in which an ionized gas is applied to the surface of an article. Plasma gases and processing conditions are described more fully in U.S. Pat. Nos. 4,312,575 and 4,632,844, which are incorporated herein by reference.

The present methods and fixture devices produce articles which have highly uniform surface treatments. One reason for the improved treatment uniformity is that the amount of article surface which is blocked or obscured from treatment gas contact is minimized. This is accomplished by providing support for the article in the form of "point-contact support locations". "Point-contact support locations", as used herein, refer to contact points between an article and a support member which are not sufficient to substantially impair the uniformity of treatment of the surface of the article. In a preferred embodiment, "point-contact support locations" means support member contacts with an article which, in sum, cover less than about one percent of the surface of the article. In a more preferred embodiment, "point-contact support locations" means support member contacts with an article over less than about 0.1 percent of the surface of the article.

The number of point-contact support locations generally must be at least three to properly support the article to be treated. Point-contact support locations which number less than three generally do not properly stabilize the article. Thus, a preferred number of point-contact support locations is at least three. There may be four or more point-contact support locations. In one preferred embodiment, there are four points support contacts, preferably separated from one another by a substantially equal distance. In another preferred embodiment, there are between about 4 and about 10 point-contact support locations.

In a preferred embodiment, the support members are made of a thin wire, fiber, or a wire-like material. Thin wires are preferred to minimize any interference or obstruction between the plasma gas and the article to be treated. Wire support members may be made from metallic or non-metallic materials. In a preferred embodiment, the wire material is a non-ferromagnetic material, including without limitation thereto, quartz, optical cable, glass fibers and fine polymeric line. Ferromagntic materials are believed to present additional interference with plasma surface treatment, because ferromagnetic materials are believed to interact with the ionized gaseous molecules. Optical fibers and polymeric fibers are particularly preferred support member materials.

Another advantage of the present invention is that an article may be surface treated in a single-step process. In prior art processes, articles have been supported on structures which substantially interfered with, or completely blocked, the treatment of at least one surface of the article. Thus, in order to treat the entire surface of the article, prior art techniques typically required the additional processing steps of: (1) halting the surface treating apparatus, (2) removing the article from the support apparatus, (3) rotating the article about 90° to 180°, (4) placing the article back into the support apparatus, (5) placing the article and support apparatus back into the treatment apparatus, and (6) initiating a second treatment cycle.

In contrast to the prior art, the present fixture devices and surface treatment methods provide means by which the entire surface of an article may be treated in one continuous, semi-continuous, or batch processing step. The advantages of treating the entire surface of an article in a single processing step are numerous. Surface treatment in a single processing step will produce fewer defective products than multi-step surface treatment processes. Also, less process downtime will occur, because less equipment is required. Further, less scrap product and waste will be generated. In addition, processing uniformity and concomitant lens product variation is reduced by the present method. Clearly, the present single-step surface treatment processes are preferable to the multi-step surface treatment processes.

A better understanding of the invention may be obtained by reference to the drawings. FIG. 1 shows a top view of one embodiment of the fixture device of the present invention with a contact lens supported thereon. In this embodiment, fixture device 10 supports contact lens 16 at four (4) point-contact support locations 18. Fixture device 10 includes a peripheral support frame 12 having article support members 14 affixed thereto. While FIG. 1 shows a substantially circular support frame, the shape of the support frame is not believed critical. Thus, the support frame shape may be chosen from a wide variety of shapes which do not substantially interfere with the uniformity of surface treatment of the article and which provide adequate structural support for the article and support members, including without limitation, circular shapes, oval shapes, rectangular shapes, triangular shapes, and the like.

Figure 2:
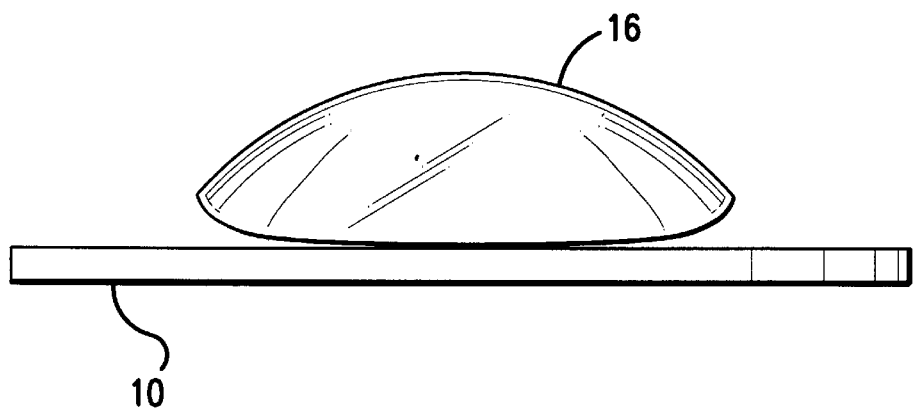
FIG. 2 is a side view of the fixture device and lens of FIG. 1.

The concave side of the contact lens is facing fixture device 10. FIG. 2 is a side view of the fixture device and lens of FIG. 1, showing the contact lens in a concave down position, i.e., the concave surface faces the fixture device. Thus, contact lens 16 rests on support members 14 only at four points along the periphery of contact lens 16. The central area of the contact lens is free from contact with any of the fixture device. Further the top, convex portion of the contact lens is entirely unobstructed by the fixture device.

Figure 3:
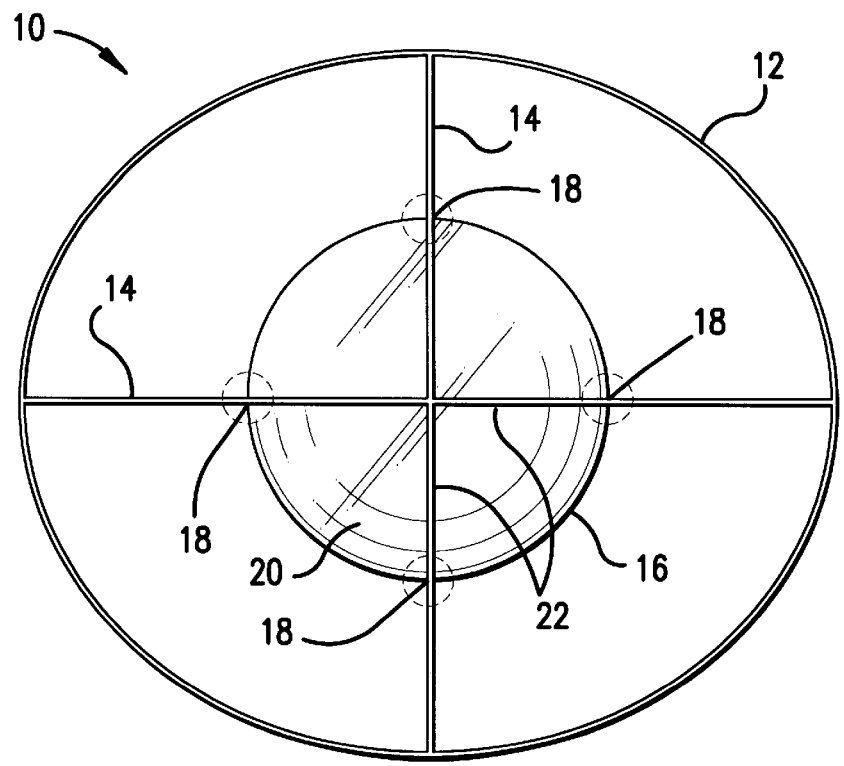
FIG. 3 is a bottom view of the fixture device and lens of FIG. 1.

FIG. 3 is a bottom view of the fixture device and lens of FIG. 1. Contact lens 16 is supported only at the four point-contact support locations 18. Concave surface 20 of lens 16 does not touch support members 14, except possibly around point-contact support locations 18, which are primarily edge contact points. Interior portions 22 of support members 14 may interfere slightly with the plasma treatment of the concave surface of the lens. However, the interference is not sufficient to substantially affect the uniformity of the surface treatment.

Figure 4:
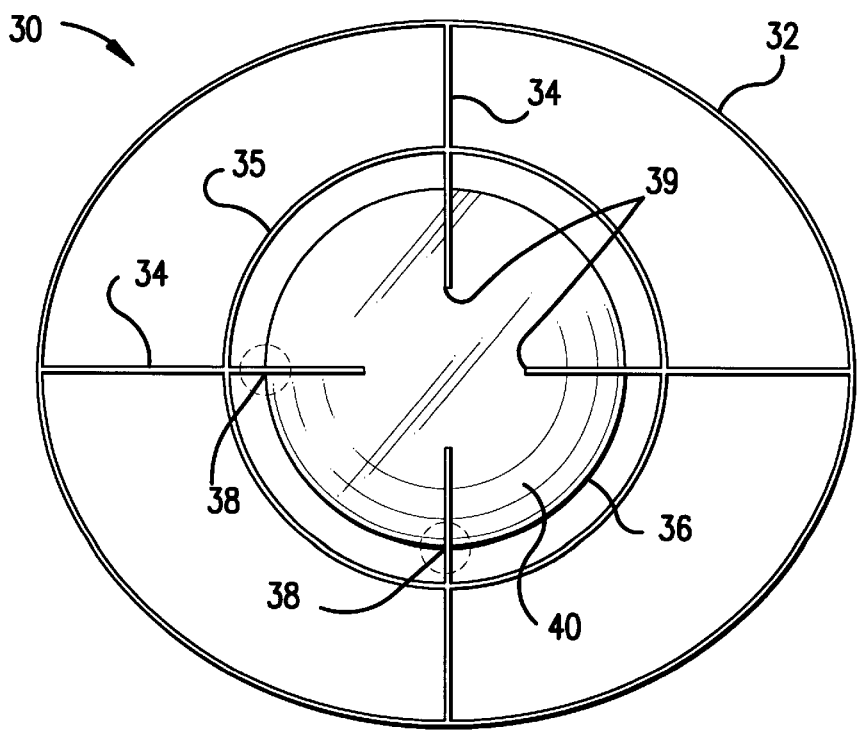
FIG. 4 is a bottom view of another embodiment of the fixture device of the present invention supporting a contact lens thereon.

FIG. 4 is a bottom view of an alternative embodiment of the present innovative fixture device which supports a contact lens thereon. Fixture device 30 includes outer peripheral support frame 32 with support members 34 which are affixed thereto and which extend inwardly. Support members 34 are not affixed to one another in this embodiment, in order to minimize support member interference with the surface treatment vapor. In order to provide additional stability, the FIG. 4 embodiment includes an optional inner peripheral support frame 35 which is affixed to support members 34 at points beyond the peripheral edge of contact lens 36. Thus, ends 39 of support members 34 do not meet, but extend a distance beyond the edge of contact lens 36, when the lens is centered on the fixture device, which distance is sufficient to support the contact lens in the event the lens is accidentally dislodged slightly from the center of the fixture device. In a preferred embodiment, support members extend at least about 0.1 mm from the edge of the lens when the lens is centered on the fixture device. The affixation of support frames to support members of the fixture device is generally not critical. The affixation may be accomplished by a number of means known in the art, such as affixation by tack welding of metal members, affixation by application of adhesives between members, affixation by shaping and interference fitting members, and the like.

Figure 5:
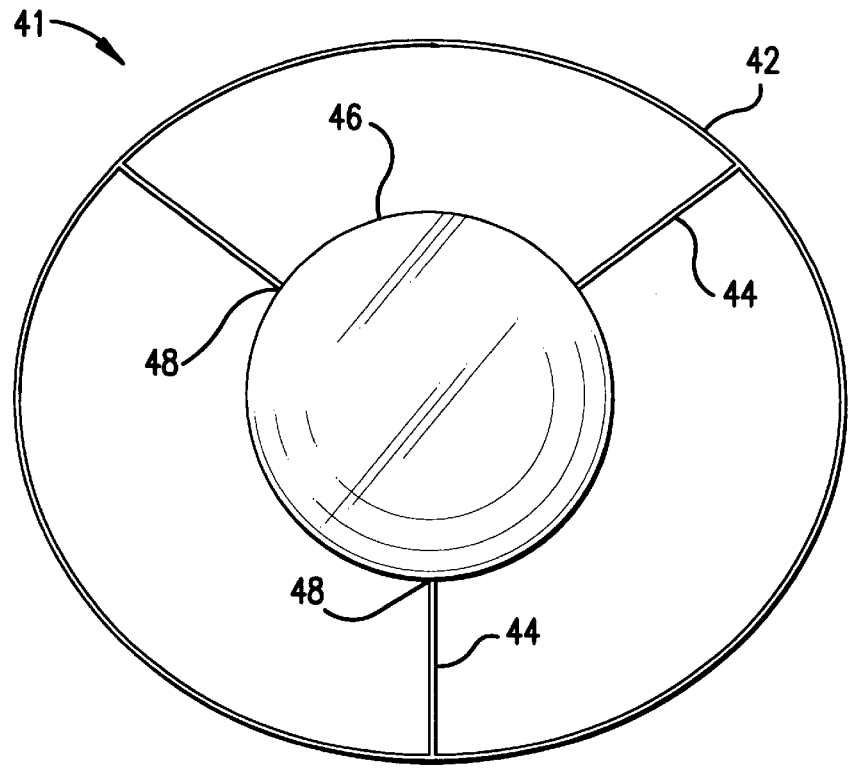
FIG. 5 is a top view of a further embodiment of the fixture device of the present invention supporting a contact lens thereon.

FIG. 5 is a top view of a further embodiment of the fixture device of the present invention supporting a contact lens thereon. Fixture device 41 includes three substantially uniformly spaced support members 44 which are affixed to peripheral support frame 42 and which extend inwardly from support frame 42. Contact lens 46 is shown supported at only three point-contact support location sites 48. The advantage of this embodiment over the embodiment of FIG. 1 is that there is even less contact by the fixture device with the contact lens, and accordingly, less interference with the surface treatment process. If the lens remains substantially centered on the device during the surface treatment process, there will be no support problems. However, if an undesirable force causes the lens to move a substantial distance off center, it is conceivable that the lens could fall off the support frame. Thus, the selection of one of these embodiments over the other depends on the details of the particular product and treatment process chosen.

Figure 6:
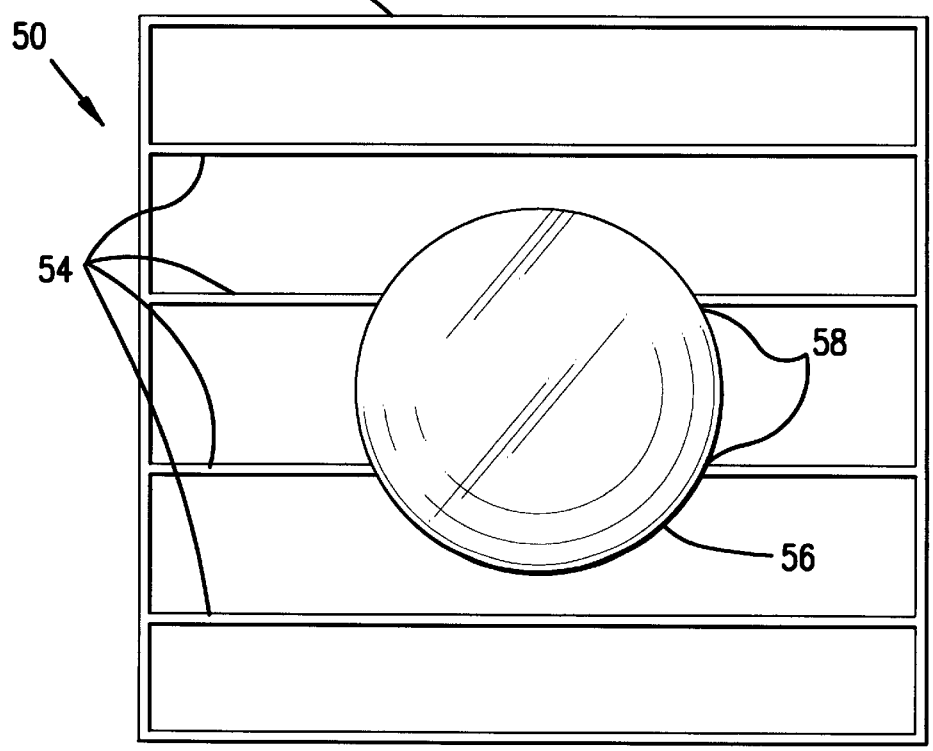
FIG. 6 is a top view of yet another embodiment of the fixture device of the present invention supporting a contact lens thereon.

FIG. 6 is a top view of yet another embodiment of the fixture device of the present invention supporting a contact lens thereon. In this embodiment, fixture device 50 includes support members 54 extending in a substantially parallel fashion from one side of rectangular support frame 52 to the other. Contact lens 56 is supported at four point-contact support locations 58 when the lens is substantially centered on the fixture device. If contact lens is dislodged along a path substantially parallel with support members 54, point-contact support location sites 58 remain at substantially the same location on the lens edge. If the lens is dislodged in a direction which is not substantially parallel to support members 54, the lens may then be supported by a new set of support members, but will not fall through the fixture device. The non-parallel dislodging may cause the lens to be supported by three support members, and thereby contact six point-contact support locations.

Thus, the present innovative fixture device, for uniformly and efficiently supporting an article to be treated in a gaseous atmosphere, may be defined as including a support structure which provides a plurality of point-contact support locations for an article to be treated. The plurality of point-contact support locations are sufficient to support the article to be treated but do not block the gaseous treatment atmosphere in an amount which prevents substantially uniform coating of the article. In a preferred embodiment, the fixture device has a support structure which includes a peripheral support frame which defines an interior opening therethrough; and at least one support member affixed to the frame, with the support member extending inwardly from the frame.

The support structure preferably includes a first support member affixed to two locations at opposite ends of the frame; and a second support member affixed to two different locations at opposite ends of the frame. Alternatively, the second support member may be affixed to the first support member alone, or may be affixed both to the frame and to the first support member. The support members may cross or may not cross in the opening defined by the frame. However, an important feature of the support members is that the support members define a plurality of point-contact support locations to retain the article to be treated.

The methods of using the present invention to uniformly and efficiently treat an article in a gaseous atmosphere generally include the steps of: providing an article to be treated; providing a support structure for the article; placing the article on the support structure such that the article is supported on a plurality of point-contact support locations; and exposing the article to treatment gas for a time and at conditions to provide a substantially uniform surface treatment to said article. The preferred treatment gas is an ionized gas, i.e., a plasma, which is preferably capable of altering the surface of the article to increase the hydrophilicity and/or biocompatibility.

The previous disclosure will enable one having ordinary skill in the art to practice the invention. The invention has been described in detail, with reference to certain preferred embodiments, in order to enable the reader to practice the invention without undue experimentation. However, a person having ordinary skill in the art will readily recognize that many of the components and parameters may be varied or modified to a certain extent without departing from the scope and spirit of the invention. Furthermore, titles, headings, or the like are provided to enhance the reader's comprehension of this document, and should not be read as limiting the scope of the present invention. Accordingly, the intellectual property rights to this invention are defined only by the following claims and reasonable extensions thereof.

That which is claimed is:

1. A fixture device for uniformly and efficiently supporting an article to be treated in a gaseous treatment atmosphere, comprising a support structure which provides a plurality of point-contact support locations for an article to be treated, wherein said plurality of point-contact support locations is sufficient to support said article to be treated but does not block contact between said article and said gaseous atmosphere enough to prevent substantially uniform treatment of said article with said gaseous atmosphere.

2. A fixture device of claim 1, wherein said plurality of point-contact support locations is at least three.

3. A fixture device of claim 1, wherein said plurality of point-contact support locations is four.

4. A fixture device of claim 1, wherein said support structure is formed from wire.

5. A fixture device of claim 1, wherein said point-contact support locations are separated from each other by a substantially uniform distance.

6. A fixture device of claim 1, wherein said support structure is adapted to support an ophthalmic lens.

7. A fixture device of claim 6, wherein said support structure is adapted to support a contact lens.

8. A fixture device of claim 1, wherein said support structure comprises:
   (a) a peripheral support frame defining an interior opening therethrough; and
   (b) at least one support member affixed to said frame and extending inwardly from said frame support an ophthalmic lens.

9. A fixture device of claim 8, wherein said peripheral support frame extends beyond the edge of said article when said article is positioned on said support member and substantially centered within said frame.

10. A fixture device of claim 8, wherein said support member is a wire or polymeric line.

11. A fixture device of claim 1, wherein said article is ophthalmic lens and said support structure comprises:
   (a) a peripheral support frame defining an interior opening therethrough;
   (b) a first support member affixed to two locations at opposite ends of said frame; and
   (c) a second support member affixed to two different locations at opposite ends of said frame support an ophthalmic lens.

12. A fixture device of claim 11, wherein said first and second members cross at substantially the center of said frame.

13. A fixture device of claim 11, wherein said first and second members do not cross.

14. A fixture device of claim 11, wherein said first and second support members are substantially straight wires or polymeric lines which are essentially perpendicular to one another.

15. A fixture device of claim 1, wherein said support structure is formed from a non-ferromagnetic material.

16. A fixture device of claim 15, wherein said non-ferromagnetic material is selected from the group consisting of quartz, optical cable, and fine polymeric line.

17. A fixture device of claim 16, wherein said non-ferromagntic material is optical cable.

18. A fixture device of claim 16, wherein said non-ferromagntic material is fine polymeric line.

19. A fixture device of claim 1, wherein said fixture device blocks less than about one percent of the supported surface of said article.

20. A fixture device of claim 19, wherein said fixture device blocks less than about 0.1 percent of the supported surface of said article.

21. A fixture device of claim 1, wherein said gaseous atmosphere is a plasma gas.

22. A fixture device of claim 1, wherein said plurality of point contacts is at least three, wherein said article is an ophthalmic lens, and wherein said support structure comprises:

(a) a frame;

(b) a non-ferromagnetic first wire affixed to said frame; and (c) a non-ferromagnetic second wire affixed to said frame or said first wire, such that said first wire crosses said second wire.

23. A fixture device of claim 1, wherein said treatment is a coating of said article.

24. A fixture device of claim 23, wherein said coating is a polymeric coating.

25. A method of uniformly and efficiently treating an article in a gaseous atmosphere, comprising the steps of:

(a) providing an article to be treated;

(b) providing a support structure for said article;

(c) placing said article on said support structure such that said article is supported on a plurality of point-contact support locations;

(d) exposing said article to treatment gas for a time and at conditions to provide a substantially uniform surface treatment to said article.

26. A method of claim 25, wherein said article is a contact lens.

27. A method of claim 25, wherein said treatment gas is a plasma gas.

28. A method of claim 25, wherein said method produces a polymeric coating on said article.

* * * * *